United States Patent
Nakashio et al.

(10) Patent No.: US 6,760,201 B2
(45) Date of Patent: Jul. 6, 2004

(54) MAGNETIC TUNNEL ELEMENT AND ITS MANUFACTURING METHOD, THIN-FILM MAGNETIC HEAD, MAGNETIC MEMORY AND MAGNETIC SENSOR

(75) Inventors: Eiji Nakashio, Miyagi (JP); Seiji Onoe, Miyagi (JP); Junichi Sugawara, Miyagi (JP)

(73) Assignee: Sony Corporation, Tokyo (JP)

( * ) Notice: Subject to any disclaimer, the term of this patent is extended or adjusted under 35 U.S.C. 154(b) by 150 days.

(21) Appl. No.: 10/059,906

(22) Filed: Jan. 29, 2002

(65) Prior Publication Data

US 2002/0114112 A1 Aug. 22, 2002

(30) Foreign Application Priority Data

Feb. 6, 2001 (JP) .................................. P2001-029946
Mar. 13, 2001 (JP) .................................. P2001-070650

(51) Int. Cl.$^7$ ............................ G11B 5/127; G11B 5/39
(52) U.S. Cl. .................................................. 360/324.2
(58) Field of Search .......................... 360/324.2, 324.1, 360/324, 313, 110

(56) References Cited

U.S. PATENT DOCUMENTS 6,295,225 B1 * 9/2001 Oepts ........................ 365/171
6,347,049 B1 * 2/2002 Childress et al. ........... 365/173
6,359,289 B1 * 3/2002 Parkin ......................... 257/43

* cited by examiner

Primary Examiner—Julie Anne Watko
(74) Attorney, Agent, or Firm—Sonnenschein, Nath & Rosenthal LLP

(57) ABSTRACT

A magnetic tunnel element (1) including a plurality of ferromagnetic films (5, 9) laminated across an insulating film (11) formed of metal oxide films (6, 7, 8) and in which asymmetric tunnel barriers are formed along the direction in which the ferromagnetic films (5, 9) are laminated by this insulating film (11) (6, 7, 8). There are also constructed a thin-film magnetic head, a magnetic memory and a magnetic sensor, each of which includes the magnetic tunnel element (1). Since a magnetoresistive ratio can be suppressed from being lowered by decreasing a bias voltage dependency, there are provided a highly-reliable magnetic tunnel element which can obtain a high output when the magnetic tunnel element is applied to a thin-film magnetic head and the like and a method of manufacturing such a magnetic tunnel element. When a magnetic head, a magnetic memory and a magnetic sensor include this magnetic tunnel element, they become highly reliable and also become able to obtain a high output.

5 Claims, 6 Drawing Sheets

Direction of Laminated Layers

MAGNETIC TUNNEL ELEMENT AND ITS MANUFACTURING METHOD, THIN-FILM MAGNETIC HEAD, MAGNETIC MEMORY AND MAGNETIC SENSOR

RELATED APPLICATION DATA

The present application claims priority to Japanese Application(s) No(s). P2001-029946 filed Feb. 6, 2001, and P2001-070650 filed Mar. 13, 2001, which application(s) is/are incorporated herein by reference to the extent permitted by law.

BACKGROUND OF THE INVENTION

1. Field of the Invention

The present invention relates to a magnetic tunnel element in which is formed a ferromagnetic tunnel junction for use in magnetic devices such as a thin-film magnetic head for reading out (reproducing), for example, high density recordings and a magnetic sensor for sensing a magnetic field and a method of manufacturing such a magnetic tunnel element. More particularly, this invention relates to a magnetic tunnel element, a manufacturing method of such a magnetic tunnel element and a thin-film magnetic head, a magnetic memory and a magnetic sensor, each using such a magnetic tunnel element.

2. Description of the Related Art

It is known that, if an electrical insulator has a thickness ranging from several angstroms to several tens of angstroms in a junction having an arrangement in which a metal, an electrical insulator and a metal are laminated, when a voltage is applied to the upper and lower metals which sandwich the electrical insulator, a very small current can flow through the electrical insulator.

This phenomenon is referred to as a "tunnel effect" and can be expressed from the standpoint of quantum mechanics.

A current which flows through the electrical insulator is called a "tunnel current".

The junction having the structure of the ferromagnetic metal/electrical insulator/ferromagnetic metal in which the upper and lower metals which sandwich the electrical insulator are made of ferromagnetic materials is referred to as a "ferromagnetic tunnel junction".

In the case of this ferromagnetic tunnel junction, the magnitude of a tunnel current depends upon the magnetization states of the upper and lower ferromagnetic metal layers. Specifically, when the directions of the two magnetizations are the same, the largest tunnel current can flow. On the other hand, when the directions of the two magnetizations are opposite to each other, a tunnel current decreases.

It has been explained that this phenomenon is caused when conduction electrons are polarized and the conduction electrons tunnel while keeping the polarization. Specifically, electrons polarized in one direction can tunnel in the polarized direction and electrons polarized in the opposite direction can tunnel in the opposite direction.

For this reason, when the magnetization directions of the upper and lower ferromagnetic metals which sandwich the insulating layer are the same direction, electrons can tunnel from the same state to the same state so that a large tunnel current can flow.

On the other hand, when the magnetization directions of the upper and lower ferromagnetic metals which sandwich the insulating layer are opposite to each other, if electrons polarized in one direction and electrons polarized in the opposite direction have no spaces for tunneling, then electrons cannot tunnel in either direction. As a result, in general, a tunnel current decreases (tunnel probability decreases).

Accordingly, there occurs a so-called magnetic tunnel effect in which the conductance of a tunnel current which flows through the insulating film varies depending upon relative angles of the magnetization directions of the upper and lower ferromagnetic metals.

Specifically, the laminated structure in which the thin insulating layer is sandwiched between the magnetic layers comprised of the pair of ferromagnetic metals may demonstrate a magnetoresistive effect against the tunnel current which flows in the insulating layer.

In this magnetic tunnel effect, a magneto-resistance changing ratio, i.e., magnetoresistive ratio (MR ratio) can be theoretically calculated by a polarizability of the magnetization of the magnetic layers comprised of the pair of ferromagnetic metals.

In particular, when the pair of magnetic layers are made of CoFe, a magnetoresistive ratio of about 50% can be expected, and hence there can be obtained a magnetoresistive ratio larger than an anisotropic magnetoresistive effect (AMR effect) and a giant magnetoresistive effect (GMR effect).

Therefore, the magnetic tunnel junction element having the laminated structure in which the thin insulating layer is sandwiched between the pair of magnetic layers (hereinafter referred to as a "TMR element") receives remarkable attention as a magnetoresistive effect element. Thus, it can be expected that this TMR element may be applied to a next generation magnetic head, a next generation magnetic sensor and further a next generation magnetic memory.

In particular, in the field of the magnetic heads, a so-called magnetic tunnel effect-type magnetic head which uses this TMR element as a magnetic sensing element for detecting a magnetic signal from a magnetic recording medium receives remarkable attention.

This TMR head is a shield type TMR head in which a TMR element is disposed between a pair of magnetic shield layers through a gap layer. When this pair of magnetic shield layers are given functions as electrodes, a gap between the pair of magnetic shield layers and the TMR element can be narrowed.

However, in the TMR head, there arises a phenomenon in which a magnetoresistive ratio (hereinafter referred to as an "MR ratio") is lowered when a bias voltage is applied to the TMR element, i.e., so-called bias voltage dependency of a magnetic tunnel element.

FIG. 1 shows this bias voltage dependence as data in actual practice. A study of FIG. 1 reveals that the magnetoresistive ratio (MR ratio) is lowered when an applied voltage is increased in the positive (+) direction or in the negative (−) direction.

The phenomenon of this bias voltage dependency is a characteristic inherent in the TMR element, and there arises a problem of how to alleviate this bias voltage dependence when a TMR head is fabricated into a device.

The problem of this bias voltage dependency becomes very important when the TMR element is applied not only to a magnetic head but also to a magnetic sensor and a magnetic memory.

SUMMARY OF THE INVENTION

For the purpose of solving the aforesaid problems, it is an object of the present invention to provide a magnetic tunnel element in which a magnetoresistive ratio can be suppressed from being lowered by decreasing a bias voltage dependency so that the magnetic tunnel element becomes highly reliable and also becomes able to obtain a high output when this magnetic tunnel element is applied to a thin-film magnetic head, and a method of manufacturing such magnetic tunnel element. Another object of the present invention is to provide a thin-film magnetic head, a magnetic memory and a magnetic sensor including the above-mentioned magnetic tunnel element and which can obtain a high output and which become highly reliable.

According to an aspect of the present invention, there is provided a magnetic tunnel element which is comprised of a plurality of ferromagnetic layers and an insulating film formed of metal oxide films, wherein the plurality of ferromagnetic element are laminated across the insulating film and the asymmetric tunnel barriers are formed by the insulating film along the laminated direction.

According to another aspect of the present invention, there is provided a method of manufacturing a magnetic tunnel element comprising a plurality of ferromagnetic films and an insulating film formed of metal oxide films wherein a plurality of ferromagnetic films are laminated across the insulating film. This method of manufacturing a magnetic tunnel element is comprised of at least the processes of depositing a metal film and forming a first metal oxide film by oxidizing the metal film and depositing a metal film on the first metal oxide film and forming a second metal oxide film by oxidizing the metal film under oxidation conditions different from the process for forming the first metal oxide film, thereby to form the insulating film.

According to a further aspect of the present invention, there is provided a thin-film magnetic head which is comprised of a magnetic tunnel element including a plurality of ferromagnetic films and an insulating film formed of metal oxide films, wherein a plurality of ferromagnetic films are laminated across the insulating film and asymmetric tunnel barriers are formed by the insulating film along the direction in which a plurality of ferromagnetic layers are laminated and upper and lower magnetic shields laminated across the magnetic tunnel element.

In accordance with a yet further aspect of the present invention, there is provided a magnetic memory which is comprised of a bit line, a word line and a magnetic tunnel element including a plurality of ferromagnetic films and an insulating film formed of metal oxide films wherein a plurality of ferromagnetic films are laminated across the insulating film and asymmetric tunnel barriers are formed along the direction in which a plurality of ferromagnetic films are laminated by the insulating film, wherein a memory cell including the magnetic tunnel element is disposed corresponding to an intersection between the bit line and the word line.

In accordance with a still further aspect of the present invention, there is provided a magnetic sensor which is comprised of a magnetic tunnel element including a plurality of ferromagnetic films and an insulating film formed of metal oxide films, wherein an asymmetric barrier is formed along the direction in which a plurality of ferromagnetic films are laminated by the insulating film and upper and lower magnetic shields are laminated across the magnetic tunnel element.

According to the arrangement of the magnetic tunnel element of the present invention, since the asymmetric tunnel barriers are formed by the insulating film along the direction in which the ferromagnetic films are laminated, the magnetoresistive ratio of the magnetic tunnel element can be suppressed from being lowered due to the bias voltage (bias voltage dependency), thereby making it possible to maintain a high magnetoresistive ratio even under the condition that the bias voltage is applied to the magnetic tunnel element.

According to the above-mentioned manufacturing method of the present invention, since the second metal oxide film is formed by oxidizing the metal film under oxidation conditions different from those of the first metal oxide film, the degree to which the first metal oxide film is oxidized and the degree to which the second metal oxide film is oxidized can be made different from each other. Thus, the insulating barriers having different heights can be formed by the first metal oxide film and the second metal oxide film so that the asymmetric insulating barrier can be formed in the insulating film of the magnetic tunnel element along the direction in which the films are laminated.

According to the arrangement of the magnetic head of the present invention, since the above magnetic head includes the above magnetic tunnel element of the present invention, the magnetoresistive ratio of the magnetic tunnel element can be suppressed from being lowered due to the bias voltage. As a result, under the condition that the bias voltage is applied to the magnetic tunnel element in order to detect whether or not the magnetoresistive is changed by a magnetic field from a recording layer of a recording medium (magnetic recording medium), it becomes possible to maintain a high output based upon the change of the magneto-resistance.

Further, according to the above arrangement of the magnetic memory of the present invention, since the magnetic memory includes the above magnetic tunnel element of the present invention, the magnetoresistive ratio of the magnetic tunnel element can be suppressed from being lowered due to the bias voltage. As a result, under the condition that the bias voltage is applied to the magnetic tunnel element in order to record information on the magnetic memory or to read out information from the magnetic memory, it becomes possible to maintain a high output based upon the change of the magneto-resistance.

Furthermore, according to the above-mentioned arrangement of the magnetic sensor of the present invention, since the magnetic sensor includes the above-mentioned magnetic tunnel element of the present invention, the magnetoresistive ratio of the magnetic tunnel element can be suppressed from being lowered due to the bias voltage. As a result, under the condition that the bias voltage is applied to the magnetic tunnel element in order to detect whether or not the magneto-resistance is changed due to an external magnetic field, it becomes possible to maintain a high output based upon the change of the magneto-resistance.

BRIEF DESCRIPTION OF THE DRAWINGS

FIGS. 11A and 11B are diagrams showing another inventive example of the magnetic memory to which the magnetic tunnel element according to the present invention is applied, wherein FIG. 11A is a perspective view showing another inventive example of the magnetic memory and FIG. 11B is a diagram showing a circuit arrangement of another inventive example of the magnetic memory.

DESCRIPTION OF THE PREFERRED EMBODIMENTS

Figure 1:
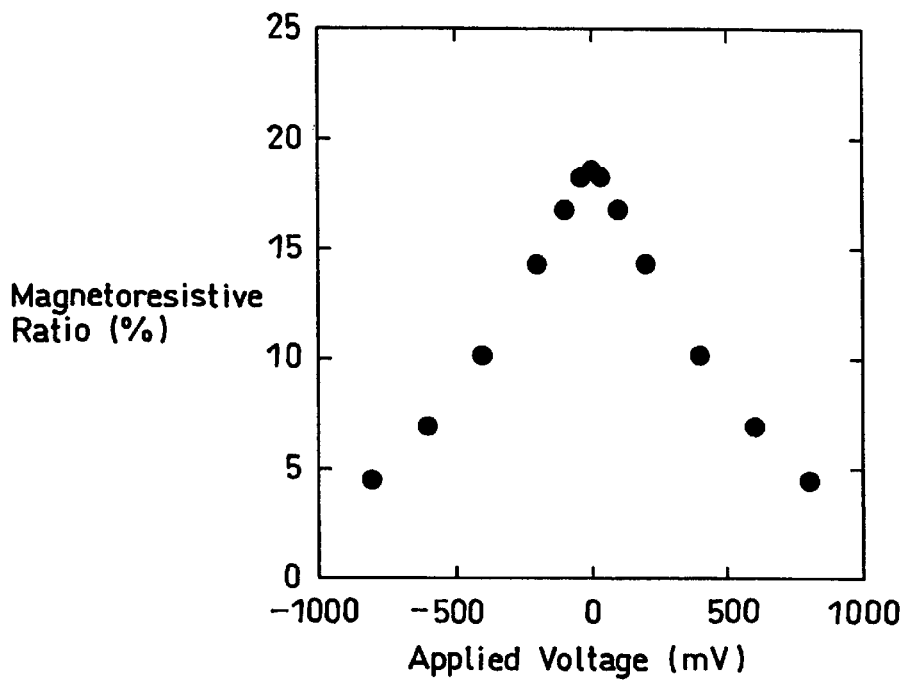
FIG. 1 is a graph showing a bias voltage dependency in a magnetic tunnel element.

The present invention will now be described below with reference to the accompanying drawings.

The present invention relates to a magnetic tunnel element laminated on a plurality of ferromagnetic films across an insulating film formed of a metal oxide film. More particularly, this invention relates to a magnetic tunnel element in which asymmetric tunnel barriers are formed along the direction of the laminated layers by an insulating film.

According to the present invention, a bias voltage is applied to the magnetic tunnel element in such a manner that a potential on the higher barrier in the asymmetric tunnel barriers may increase.

According to the present invention, in the magnetic tunnel element, a metal oxide film is formed of metal oxide films of at least no less than one kind selected from an aluminum oxide film, a tantalum oxide film and a magnesium oxide film.

The present invention relates to a method of manufacturing a magnetic tunnel element laminated on a plurality of ferromagnetic films across an insulating film formed of metal oxide films. More particularly, this invention relates to a manufacturing method of a magnetic tunnel element comprising at least a process for depositing a metal film and forming a first metal oxide film by oxidizing this metal film and a process for depositing a metal film on the first metal oxide film and forming a second metal oxide film by oxidizing this metal film under oxidation conditions different from those of the process for forming the first metal oxide film, to thereby form an insulating film.

The present invention relates to a thin-film magnetic head comprising a magnetic funnel element laminated between a plurality of ferromagnetic films across an insulating film formed of a metal oxide film and in which asymmetric tunnel barriers are formed along the direction of the laminated layer by the insulating film and upper and lower magnetic shield layers laminated across the magnetic tunnel element.

The present invention relates to a magnetic memory comprising a magnetic tunnel element laminated among a bit line, a word line and a plurality of ferromagnetic films across an insulating film formed of metal oxide films and in which asymmetric tunnel barriers are formed along the direction of the laminated layers by this insulating film and in which a memory cell including the magnetic tunnel element is disposed corresponding to an intersection between the bit line and the word line.

The present invention relates to a magnetic sensor comprising a magnetic tunnel element laminated among a plurality of ferromagnetic films across an insulating film formed of metal oxide films and in which an asymmetric barrier is formed along the direction of the laminated layer by the insulating film and upper and lower magnetic shields laminated across the magnetic tunnel element.

Prior to the description of the preferred embodiments of the present invention, the outline of a magnetic tunnel element according to the present invention will be described.

Figure 2:
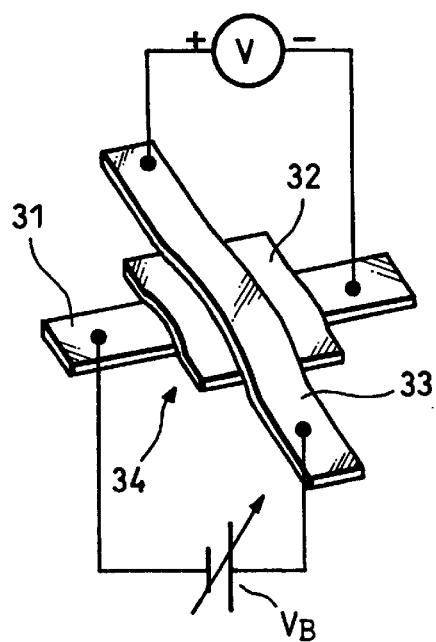
FIG. 2 is a perspective view schematically showing a magnetic tunnel element to which the present invention can be applied.

A magnetic tunnel element according to the present invention is applied to a magnetic tunnel element 34 having a structure such that an insulating layer 32 is sandwiched between a lower ferromagnetic layer 31 and an upper ferromagnetic layer 33 as schematically shown in FIG. 2.

When the magnetic tunnel element 34 shown in FIG. 2 has a so-called spin bulb structure in which the lower ferromagnetic layer 31 is formed as a magnetization free layer, for example, and the upper ferromagnetic layer 33 is formed as a magnetization fixed layer, for example, it is possible to make the aforementioned magnetic tunnel junction element (TMR element).

In the insulating layer 32 sandwiched between the lower and upper ferromagnetic layers 31 and 33, the magnetic tunnel element according to the present invention is characterized by the structure and the material of this insulating layer 32.

Next, the specific embodiments of the present invention will be described.

Figure 3:
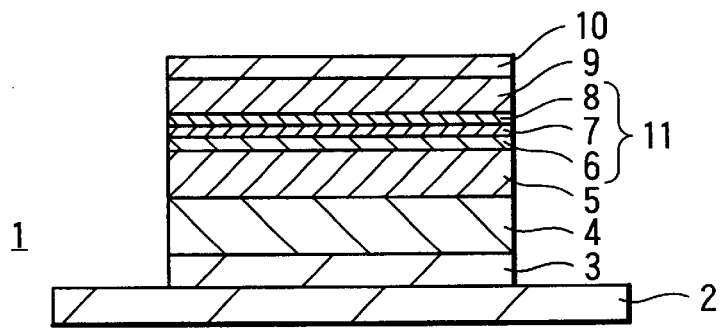
FIG. 3 is a schematic diagram (cross-sectional view) showing a magnetic tunnel element according to an embodiment of the present invention.

FIG. 3 is a schematic diagram (cross-sectional view) of a magnetic tunnel element according to an embodiment of the present invention.

As shown in FIG. 3, a magnetic tunnel element, generally depicted by reference numeral 1, has a structure such that an antiferromagnetic layer 4, a first ferromagnetic layer 5, a tunnel barrier layer 11 formed of an insulating film comprised of a metal oxide film, a second ferromagnetic layer 9 and a surface protecting layer 10 are laminated on a substrate 2 formed of a silicon substrate or the like through an underlayer 3, in that order.

Since the first ferromagnetic layer 5 and the second ferromagnetic layer 9 are laminated through the tunnel barrier layer 11, if a voltage is applied between these ferromagnetic layers 5 and 9, then a tunnel current can flow through the tunnel barrier layer The first ferromagnetic layer 5 is made of a ferromagnetic material such as Co and Fe. If the first ferromagnetic layer 5 is interactively exchanged with and bonded to the antiferromagnetic layer 4 of the lower layer, then the first ferromagnetic layer 5 is formed as a magnetization fixed layer the magnetization direction of which is fixed to a predetermined direction.

The second ferromagnetic layer 9 is formed by lamination of, for example, CoFe and NiFe, each being a ferromagnetic metal. Since NiFe has a low coercive force Hc and its magnetization direction can easily change in response to an external magnetic field, a tunnel effect can be achieved by the change of this magnetization direction. Specifically, the second ferromagnetic layer 9 is formed as a magnetization free layer the magnetization direction of which can change in response to the external magnetic field.

Specifically, since this magnetic tunnel element 1 has the structure such that the magnetization fixed layer (the first ferromagnetic layer) 5 and the magnetization free layer (the second ferromagnetic layer) 9 are laminated through the tunnel barrier layer 11 formed of the insulating film, there can be provided the magnetic tunnel element (TMR element) having a magnetoresistive effect (MR effect) in which the magnetization direction of the magnetization free layer 9 changes in response to the external magnetic field to cause a resistance to change with respect to a tunnel current.

When the magnetic tunnel element 1 is formed as the so-called spin bulb type laminated structure using the magnetization fixed layer 5 and the magnetization free layer 9 as described above, there can be realized a high magnetoresistive ratio (MR ratio) under the condition that a low external magnetic field is being applied thereto.

In the embodiment of the present invention, the tunnel barrier layer 11 formed of the insulating layer, in particular, is formed to have a laminated layer structure of metal oxide films of three layers of a first metal oxide film 6, a second metal oxide film 7 and a third metal oxide film 8 as shown in FIG. 2.

The metal oxide films 6, 7 and 8 of the three layers consists of metal oxide films made of materials which are different between adjacent metal oxide films.

Then, each of the metal oxide films can be selected from among an Al oxide film, a Ta oxide film, an MgO film and the like.

Since the metal oxide films made of different materials are laminated as described above, heights of the respective metal oxide films are different from each other. As a result, there is formed an asymmetric tunnel barriers layer 11 along the direction in which the metal oxide films are laminated.

Figure 4:
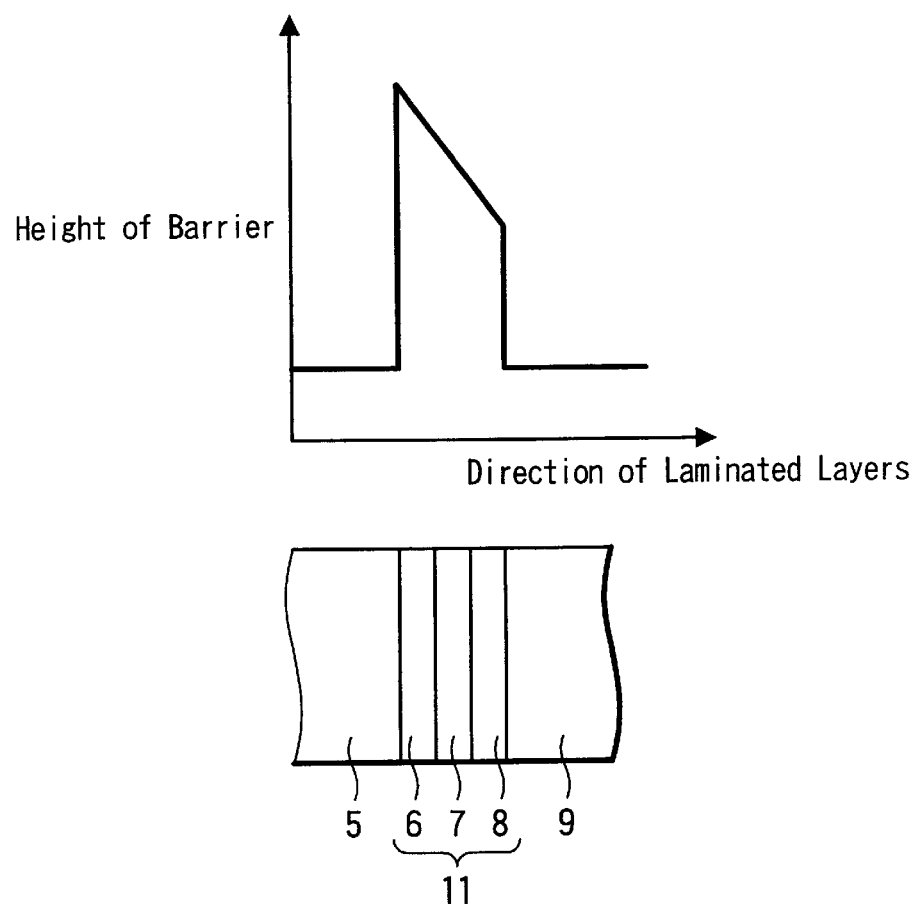
FIG. 4 is a diagram showing a distribution of heights of barriers of a tunnel barrier layer along the direction of the laminated layers.

To be concrete, as illustrated in FIG. 4 which shows distributions of heights of the barriers of the tunnel barrier layer 11 along the direction in which the metal oxide films are laminated, the heights of the barriers of the tunnel barrier layer 11 are asymmetrical along the direction in which the metal oxide films are laminated (film thickness direction) with the result that the barrier is high on the first ferromagnetic layer 5 side (the first metal oxide film 6) of the lower layer and the barrier is low on the second ferromagnetic layer 9 side (the third metal oxide film 8) of the upper layer.

Then, the materials of the respective metal oxide films of the first metal oxide film 6, the second metal oxide film 7 and the third metal oxide film 8 comprising the tunnel barrier layer 11 are selected in the way that the heights of the barriers are distributed as shown in FIG. 4, for example.

When the metal oxide films 6, 7 and 8 of the three layers shown in FIGS. 3 and 4 are constructed of the three metal oxide films of the above-mentioned Al oxide film, Ta oxide film and MgO film, for example, since the heights of the tunnel barriers formed by the metal oxide films have turned out to be sequentially Al oxide film>Ta oxide film>MgO film, it is arranged that the first metal oxide film 6 is formed of the Al oxide film, the second metal oxide film 7 is formed of the Ta oxide film and the third metal oxide film 8 is formed of the MgO film, respectively.

While the heights of the insulating barriers are changed linearly in FIG. 4, the present invention is not limited thereto and the heights of the insulating barriers may be changed in a staircase fashion, i.e., in a stepwise fashion to thereby achieve similar effects.

The magnetic tunnel element 1 according to this embodiment can be manufactured as follows, for example.

First, the underlayer film 3 is deposited on the substrate 1 made of silicon, for example. By way of example, a Ta film is deposited on the substrate 2 and an NiFe film and a Cu film are further deposited by sputtering, in that order, whereby there can be formed the underlayer film 3 by the lamination of the three layers.

On this underlayer film 3, there is deposited the antiferromagnetic layer 4 formed of an IrMn film, for example.

Next, on this antiferromagnetic film 4, there is deposited the first ferromagnetic layer (magnetization fixed layer) 5 formed of a CoFe film, for example.

Subsequently, an Al oxide film, for example, is formed on the first ferromagnetic layer (magnetization fixed layer) 5 as the first metal oxide film 6.

At that very time, after an Al film has been temporarily deposited on the first ferromagnetic layer (magnetization fixed layer) 5, an Al oxide film is formed by oxidizing an Al film with the use of oxygen-plasma.

In a like manner, a Ta oxide film, for example, is deposited on the first metal oxide film 6 as the second metal oxide film 7. Also in this case, after the Ta film has been temporarily deposited on the first metal oxide film 6, the Ta oxide film is formed by oxidizing the Ta film with the use of oxygen-plasma, for example.

Further, an MgO film, for example, is deposited on the second metal oxide film 7 as the third metal oxide film 8.

These first metal oxide film 6, second metal oxide film 7 and third metal oxide film 8 constitute the tunnel barrier layer 11 of the three-layer structure.

Next, a CoFe film, for example, having a thickness of 4 nanometers, for example, is formed on the third metal oxide film 8 of the tunnel barrier layer 11, further, an NiFe film having a thickness of 5 nanometers, for example, is formed and the second ferromagnetic layer (the magnetization free layer) 9 formed of the laminated layer structure of the CoFe film and the NiFe film is formed.

Subsequently, the surface protecting layer 10 formed of a Ta film, for example, having a thickness of 5 nanometers, for example, is deposited on the second ferromagnetic layer 9.

In this manner, there can be manufactured the magnetic tunnel element 1 having the arrangement shown in FIG. 3.

As described above, since the metal oxide films are formed by the deposition of the metal films and the oxidation of the metal films so that the first metal oxide film 6, the second metal oxide film 7 and the third metal oxide film 8 are formed sequentially and the tunnel barrier layer 11 comprised of the metal oxide films 6, 7, 8 of the three layers is formed, the heights of the insulating barriers provided by the respective metal oxide films can easily be controlled by controlling the extent to which the metal films are oxidized.

Accordingly, it becomes possible to form a desired insulating barrier, i.e., the asymmetric insulating barrier along the direction of the laminated layers of the magnetic tunnel element 1, for example.

According to the magnetic tunnel element 1 of the embodiment of the present invention, the tunnel barrier layer 11 is comprised of the first metal oxide film 6, the second metal oxide film 7 and the third metal oxide film 8 which are respectively made of materials different between adjacent metal oxide films.

Thus, the heights of the insulating barriers formed by the respective metal oxide films 6, 7, 8 become different between the adjacent metal oxide films.

Accordingly, the insulating barriers in the tunnel barrier layer 11 become asymmetrical along the direction of the laminated layers of the magnetic tunnel element 1, i.e., the film thickness direction of the tunnel barrier layer 11.

In accordance with the tunnel barrier layer 11 having the asymmetric insulating barrier along the lamination direction of the magnetic tunnel element 1, the magnetoresistive ratio (MR ratio) of the magnetic tunnel element 1 can be suppressed from being lowered when a bias voltage is applied to the magnetic tunnel element 1.

When the metal oxide films 6, 7, 8 constituting the tunnel barrier layer 11 are formed by oxidizing the metal films after the metal films have been deposited, since the heights of the insulating barriers of the metal oxide films 6, 7, 8 can easily be controlled compared to when metal oxide films (alumina films, etc.) are directly formed, the distribution of the insulating barriers of the tunnel barrier layer 11 can easily be controlled in a way that the asymmetric insulating barriers may be formed along the direction of the laminated layers of the magnetic tunnel element 1.

Accordingly, it is possible to easily manufacture the high-quality magnetic tunnel element 1 in which a bias voltage dependency of the magnetoresistive ratio (MR ratio) can be suppressed by forming the tunnel barrier layer 11 having the asymmetric insulating barriers along the direction of the laminated layers of the magnetic tunnel element 1.

When the tunnel barrier layer 1 is formed by metal oxide films of two layers, an Al oxide film can be used as a lower layer and a Ta oxide film can be used as an upper layer, for example. At that time, a thickness of the Al oxide film of the lower layer can be selected to be about 0.4 nanometer and a thickness of the Ta oxide film of the upper layer can be selected to be about 0.4 nanometer, respectively.

Figure 5:
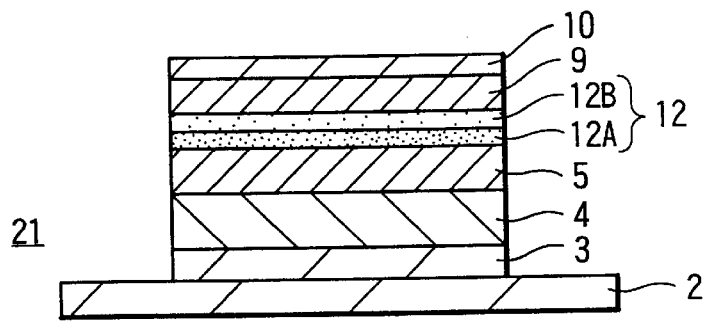
FIG. 5 is a schematic diagram (cross-sectional view) showing a magnetic tunnel element according to another embodiment of the present invention.

Next, FIG. 5 shows a schematic diagram (cross-sectional view) of the arrangement of a magnetic tunnel element according to another embodiment of the present invention.

In a magnetic tunnel element 21 according to this embodiment, in particular, an arrangement of a tunnel barrier layer 12 formed between the first ferromagnetic layer (the magnetization fixed layer) and the second ferromagnetic layer (magnetization free layer) 9 differs from that of the tunnel barrier layer 11 of the magnetic tunnel element 1 shown in FIG. 3.

Since the rest of an arrangement of the magnetic tunnel element 21 shown in FIG. 5 is similar to that of the magnetic tunnel element 1 according to the preceding embodiment shown in FIG. 3, elements and parts identical to those of FIG. 3 are identified by identical reference numerals and need not be described in detail.

As shown in FIG. 5, a tunnel barrier layer 12 is comprised of metal oxide films whose oxidation degree changes progressively from the first ferromagnetic layer (magnetization fixed layer) 5 side of the lower layer to the second ferromagnetic layer (magnetization free layer) 9 side of the upper layer.

For example, a portion 12A on the first ferromagnetic layer 5 side of the lower layer in the tunnel barrier layer 12 may increase a degree of oxidation and a portion 12B on the second ferromagnetic layer 9 side of the upper layer may decrease a degree of oxidation.

When the tunnel barrier layer 12 is constructed in such a manner that the degrees of oxidation change progressively, since the heights of the insulating barriers provided by the respective portions 12A and 12B become different from each other, asymmetric insulating barriers are formed in the tunnel barrier layer 12 similarly to the preceding embodiment of the present invention.

Specifically, when the degree of oxidation in the portion 12A of the first ferromagnetic layer 5 side of the lower layer increases, the height of the tunnel barrier may increase. When the degree of oxidation in the portion 12B of the second ferromagnetic layer 9 side of the upper layer decreases, the height of the tunnel barrier may decrease. As a result, it is possible to provide a distribution of the heights of the barriers similarly to FIG. 3.

Also in this case, the metal oxide films comprising the tunnel barrier layer 12 can be selected from among an Al oxide film, a Ta oxide film, an MgO film and the like.

Then, the degree of oxidation may be changed by changing the conditions of oxidation required when the metal oxide films are formed.

The magnetic tunnel element 21 according to this embodiment can be manufactured as follows, for example.

First, the underlayer film 3 is deposited on the substrate 2 made of silicon, for example. For example, a Ta film is deposited on the substrate 2 and an NiFe film and a Cu film are further deposited, in that order, whereby the underlayer film 3 comprising the laminated layer of the three layers can be formed.

On this underlayer film 3, there is deposited the antiferromagnetic layer 4 comprised of an IrMn film, for example.

Next, on this antiferromagnetic film 4, there is deposited the first ferromagnetic layer (magnetization fixed layer) 5 formed of the CoFe film, for example.

Subsequently, an Al oxide film having a thickness of 4 nanometers, for example, is formed on the first ferromagnetic layer (magnetization fixed layer) 5 as the metal oxide film which serves as the portion 12A of the lower layer of the tunnel barrier layer 12.

At that time, the Al oxide film is formed by oxidizing the Al film according to oxidation using oxygen-plasma after the Al film has been temporarily deposited on the first ferromagnetic layer (magnetization fixed layer) 5.

Similarly, an Al oxide film having a thickness of 4 nanometers, for example, whose degree of oxidation is small is formed on the portion 12A of the lower layer of this tunnel barrier layer 12, e.g., Al oxide film as the metal oxide film serving as the portion 12B of the upper layer of the tunnel barrier layer 12.

At that time, after an Al film has been temporarily deposited on the Al oxide film of the lower layer, the Al film is oxidized according to oxidation using oxygen-plasma, for example, and the Al oxide film is formed by controlling the oxidation condition in such a manner that the degree of progress of oxidation may become small.

These metal oxide films 12A, 12B constitute the tunnel barrier layer 12 in which the insulating barriers are made asymmetric.

Next, a CoFe film having a thickness of 4 nanometers, for example, is formed on the tunnel barrier layer 12. Further, an NiFe film having a thickness of 5 nanometers, for example, is formed and the second ferromagnetic layer (magnetization free layer) 9 comprised of the laminated layer structure of the CoFe film and the NiFe film is formed.

Subsequently, on the second ferromagnetic layer 9, there is formed the surface protecting film 9 formed of a Ta film having a thickness of 5 nanometers, for example.

In this manner, it is possible to manufacture the magnetic tunnel element 21 having the arrangement shown in FIG. 5.

According to the magnetic tunnel element 21 of this embodiment, since the portion 12A of the lower layer of the tunnel barrier layer 12 and the portion 12B of the upper layer become different from each other in the degree of oxidation of metal oxide film, the height of the insulating barrier formed by the portion 12A of the lower layer and the height of the insulating barrier formed by the portion 12B of the upper layer become different from each other.

Thus, the insulating barriers in the tunnel barrier layer 12 become asymmetric in the direction of the laminated layers of the magnetic tunnel element 21, i.e., in the film thickness direction of the tunnel barrier layer 12.

As described above, according to the tunnel barrier layer 12 having the asymmetric insulating barriers in the direction of the laminated layers of the magnetic tunnel element 21, similarly to the magnetic tunnel element 1 of the preceding embodiment, it is possible to suppress the magnetoresistive ratio (MR ratio) of the magnetic tunnel element 21 from being lowered when a bias voltage is applied to the magnetic tunnel element 1.

The portion 12A of the lower layer in the tunnel barrier layer 12 and the portion 12B of the upper layer are respectively formed by oxidizing the metal films after the metal films have been deposited and the condition of oxidation of the portion 12A of the lower layer and that of the portion 12B of the upper layer are made different from each other, whereby the insulating barriers having different heights can easily be formed on the portion 12A of the lower layer and the portion 12B of the upper layer, respectively.

As a consequence, a distribution of the insulating barriers of the tunnel barrier layer 12 can easily be controlled in such a manner that the insulating barriers may become asymmetric along the direction of the laminated layers of the magnetic tunnel element 21.

Accordingly, it is possible to easily manufacture the high-quality magnetic tunnel element 21 in which the bias dependency of the magnetoresistive ratio (MR ratio) can be suppressed by forming the tunnel barrier layer 12 having the asymmetric insulating barriers formed along the direction of the laminated layers of the magnetic tunnel element 21.

While the portions of the magnetic tunnel elements 1, 21 are shown on a large-scale in FIGS. 3 and 5 so as to make the characteristics of the magnetic tunnel elements 1, 21 become clearer, in elements, actually, the magnetic tunnel elements 1, 21 are quite narrow in width and thin in thickness as compared with the substrate 2.

While the magnetic tunnel element has the structure (so-called bottom-spin type structure) in which the first ferromagnetic layer 5 of the lower layer of the tunnel barrier layer 11 is formed as the magnetization fixed layer and the second ferromagnetic layer 9 of the upper layer of the tunnel barrier layer 11 is formed as the magnetization free layer in the above-mentioned first and second embodiments, the present invention is not limited thereto and the magnetic tunnel element according to the present invention may have a structure (so-called top-spin type structure) in which these magnetization fixed layer and magnetization free layer may be reversed.

Further, a magnetic tunnel element can be constructed by combining the arrangements of the above-mentioned first and second embodiments of the present invention.

Specifically, a tunnel barrier layer, for example, may have a three-layer structure in which a magnetic tunnel element can be constructed by sequentially laminating, from the lower layer, an Al oxide film having a large degree of oxidation, an Al oxide film having a small degree of oxidation and a Ta oxide film.

According to this arrangement, since the insulating barriers of the tunnel barrier layer become asymmetric and the height of the barrier increases in the lower layer, there can be achieved effects similar to those of the above-mentioned first and second embodiments of the present invention.

The present invention is not limited to the materials, the numerical values and the like enumerated in the above-mentioned first and second embodiments with respect to the arrangements of the respective layers comprising the magnetic tunnel element, their materials, sizes, film thicknesses and the like.

Here, action and effects, achieved by the magnetic tunnel element according to the present invention, i.e., the magnetic tunnel element having the tunnel barrier layer in which the asymmetric insulating barriers are formed along the direction of the laminated layers of the magnetic tunnel element, will be described more in detail.

In general, a magnetic tunnel effect in a magnetic tunnel element has the aforementioned bias voltage dependency in which the MR ratio can rapidly decrease with the increase of the applied bias voltage.

On the contrary, since the magnetic tunnel element according to the present invention including the magnetic tunnel elements 1, 21 according to the above-mentioned first and second embodiments have the tunnel barrier layer in which the asymmetric insulating barriers are formed along the direction of the laminated layers of the magnetic tunnel element, i.e., along the film thickness direction of the insulating films, even though a bias voltage increases, a decrease of a magnetoresistive ratio becomes relatively small so that a bias voltage dependency can be alleviated.

As a consequence, under the condition that a bias voltage is applied to a device to operate the device including a magnetic tunnel element, a relatively high (higher than a conventional) magnetoresistive ratio can be maintained and there can be obtained a stable and high output by an output obtained by the change of the magneto-resistance.

Since the heights of the insulating barriers formed by the respective metal oxide films are controlled by changing the laminated layer structures of the metal oxide films, i.e., conditions such as the materials, the film thicknesses, the number of layers of the respective metal oxide films and the like so that the distributed states of the insulating barriers in the tunnel barrier layer can be controlled, it becomes possible to increase or decrease, i.e., control the degree to which the magnetoresistive ratio is changed with the application of the bias voltage.

In a like manner, since the degrees of oxidation are made different by changing the conditions of oxidation in the respective metal oxide films and the distributed states of the insulating barriers in the tunnel barrier layer can be controlled by controlling the heights of the insulating barriers formed by the respective metal oxide films, it becomes possible to control the degree to which the magnetoresistive ratio is changed with the application of the bias voltage.

Thus, when the magnetic tunnel element according to the present invention is applied to a device in which a magnitude of a bias voltage has already been determined (thin-film magnetic head, magnetic memory, magnetic sensor and the like) by changing the structures of the metal oxide films comprising the tunnel barrier layer, it becomes possible to adjust the magneto-resistance in such a manner that a magnetoresistive effect in a bias voltage which actually operates the device may be prevented from decreasing.

In the above-described first and second embodiments of the present invention, the magnetic tunnel element had the arrangement in which the heights of the insulating barriers formed by the metal oxide films comprising the tunnel barrier layer 11 or 12 may increase from the lower layer toward the upper layer (see FIG. 4).

As described above, the heights of the insulating barriers should preferably increase or decrease progressively along the direction of the laminated layers of the magnetic tunnel element, whereby the bias voltage dependency can be alleviated more effectively.

However, if at least the insulating barriers are made asymmetric along the direction of the laminated layers, then the magnetic tunnel element can achieve advantageous effects as compared with the case in which insulating barriers are made symmetric.

Specifically, since the insulating barriers are made asymmetric, if the heights of the barriers of the upper layer and the lower layer are respectively integrated along the direction of the laminated layers, then resultant integrated values are changed. As a result, the bias voltage dependency varies in accordance with the direction in which the bias voltage is applied.

Then, if the side in which magneto-resistive change increases, e.g., the side in which an integrated value of the height of the barrier is set to low potential, then it is possible to effectively alleviate the bias voltage dependency.

Further, let us show data obtained when asymmetric insulating barriers are actually formed by the insulating layers comprising the metal magnetic films.

First, a method of measuring resistance changes due to a magnetoresistive effect will be described with reference to FIG. 2.

A bias voltage VB is applied to one end of the first ferromagnetic layer 31 and one end of the second ferromagnetic layer 33 from a voltage variable power-source. A voltmeter V is connected to the other end of the first ferromagnetic layer 31 and the other end of the second ferromagnetic layer 33.

Then, under the condition that the bias voltage VB is fixed to a certain voltage value, by changing a magnitude of an external magnetic field, changes in the magnitude of a tunnel current which flows through the insulating layer 32 is measured by the voltmeter V as a change of a voltage.

Since the direction of the magnetization of the magnetization free layer (the first ferromagnetic layer of the lower layer) 31 is changed due to the changes in the magnitude of the external magnetic field so that a conductance (resistance) R against a tunnel current flowing through the insulating layer 32 of the magnetic tunnel element 34, a current amount of a tunnel current against the same bias voltage VB is changed. Therefore, it is possible to calculate, with the voltmeter V, the change of the resistance R by measuring the change of the voltage as corresponds to the change of the tunnel current.

Then, a difference between the maximum value and the minimum value of the resistance R is defined as a resistance change $\Delta R$.

Figure 6:
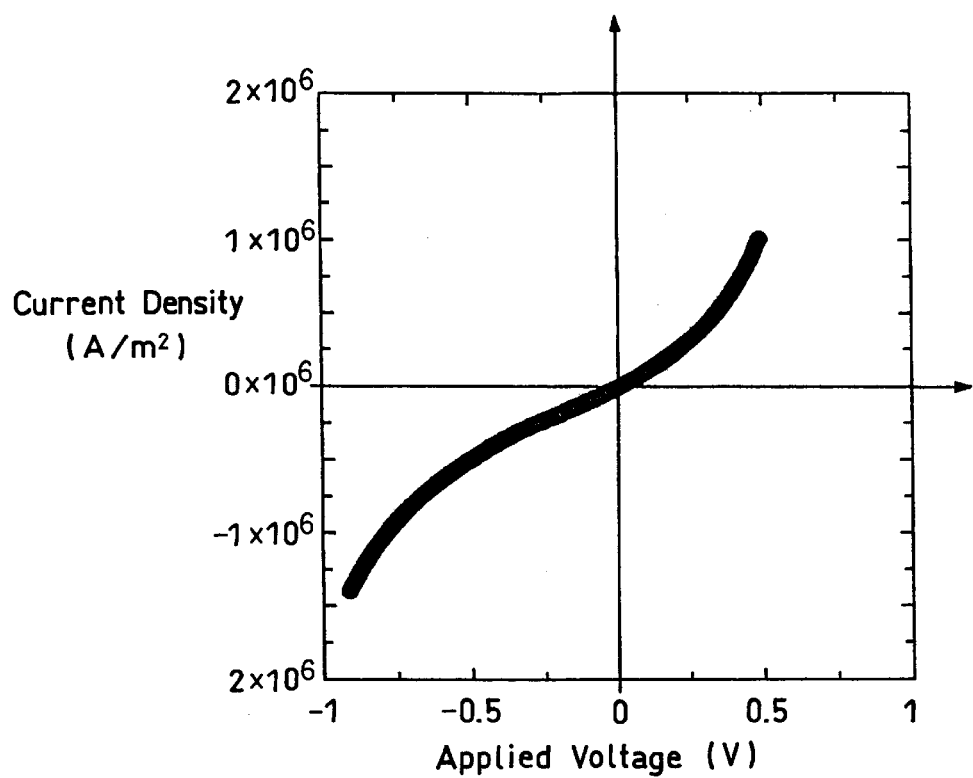
FIG. 6 is a graph showing voltage versus current characteristics when two kinds of oxide films of an Al oxide film and a Ta oxide film are laminated.

FIG. 6 shows voltage versus current characteristics obtained when the tunnel barrier layer is formed by laminating the oxide films of the two kinds of the Al oxide film and the Ta oxide film.

In FIG. 6, + assumes the case in which a sense current (tunnel current) flows from the upper electrode side to the lower electrode side, i.e., the bias voltage is applied to the direction in which the first ferromagnetic layer 31 side of the lower layer becomes a low potential and the second ferromagnetic layer 33 side of the upper layer becomes a high potential and − assumes the case in which the sense current flows to the opposite direction.

In the general magnetic tunnel element, as earlier noted with reference to FIG. 1, the bias voltage dependency of the MR ratio becomes symmetric when the bias voltage is held at 0V, and the change of the MR ratio is substantially the same even though the direction in which the bias voltage is applied is reversed.

In the general magnetic tunnel element, the barriers of the tunnel barrier layer comprising the insulating films are symmetric with respect to the film thickness direction and the heights of the barriers are made constant.

Then, it becomes clear that, when the voltage-current characteristic of the tunnel barrier layer comprising the insulating films become symmetric with respect to the origin, the heights of the insulating barriers of the tunnel barrier layer become nearly constant with respect to the film thickness direction.

On the contrary, the voltage-current characteristic shown in FIG. 6 becomes $1 \times 10^6$ A/m2 when the applied voltage is held at +0.5V and becomes $-0.5 \times 10^6$ A/m2. Thus, the voltage-current characteristic shown in FIG. 6 is not symmetric.

Accordingly, in the case of FIG. 6, the insulating barriers of the tunnel barrier layer have asymmetry.

Then, a study of FIG. 6 reveals that since the current density is large when the voltage is + and the upper layer is held at the high potential, the Al oxide film side of the lower layer have higher insulating barriers.

Figure 7:
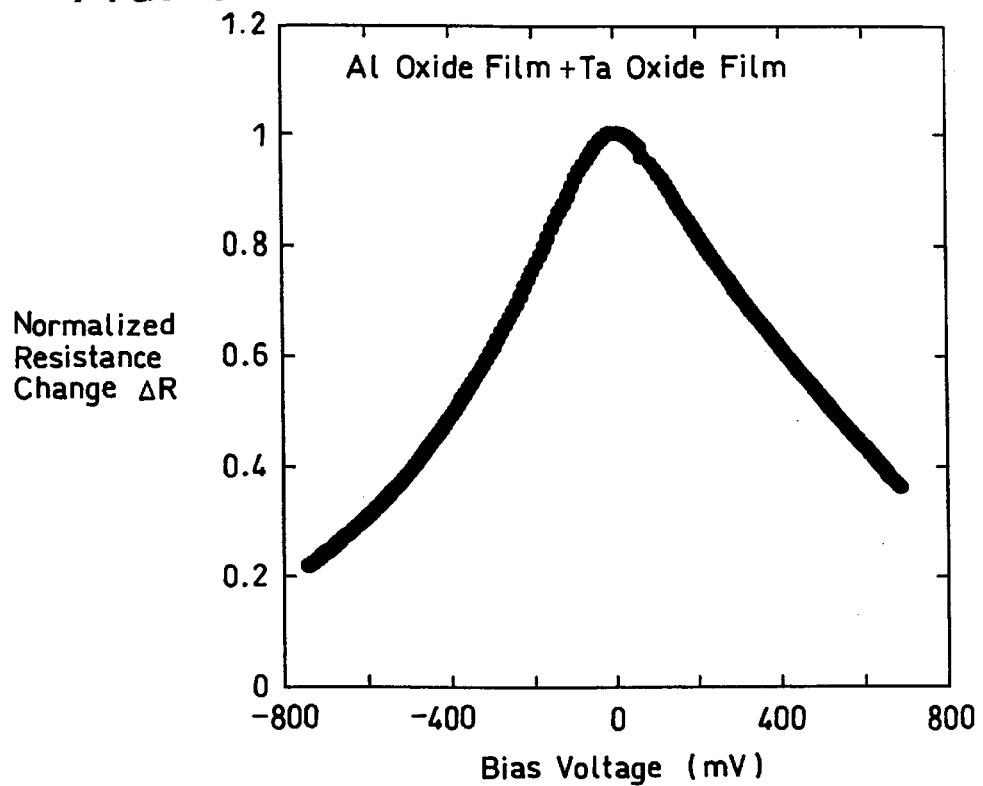
FIG. 7 is a graph showing a bias voltage dependency of a standardized ΔR obtained when a Ta oxide film is laminated on an Al oxide film.

Subsequently, FIG. 7 shows a bias voltage dependency of a normalized $\Delta R$ obtained when the Ta oxide film is laminated on the Al oxide film. The normalized resistance change $\Delta R$ is obtained when the magnitude of the resistance change $\Delta R$ brought by the external magnetic field where the bias voltage is set to +1 mV is set to 1. The normalized resistance change $\Delta R$ is obtained when the magnitude of the resistance change $\Delta R$ in other bias voltage (potential difference is higher than 1 mV) is divided by the bias voltage VB. Also in this case, the direction of the bias voltage is set to + when the tunnel current flows from the upper electrode to the lower electrode.

A study of FIG. 7 reveals that the bias voltage dependency differs depending upon the direction of the bias voltage and that, when the direction of the applied bias voltage is set to +, the normalized resistance change $\Delta R$ is large and the bias voltage dependency is alleviated as compared with the case in which the direction of the applied bias voltage is set to − and the same potential difference is obtained.

As shown in FIG. 7, the bias voltage dependency of the normalized resistance change $\Delta R$ of the bias voltage dependency is alleviated, whereby the bias voltage dependency of the magnetoresistive ratio (MR ratio) is alleviated similarly.

Accordingly, a study of FIG. 7 reveals that, when the bias voltage is applied in the direction in which the MR ratio increases (+ voltage side in FIG. 7) so that the tunnel current can flow, the magnetic tunnel element becomes able to output a high reproduced output as compared with the case in which the bias voltage is applied in the opposite direction, i.e., in the direction in which the MR ratio decreases (− voltage side in FIG. 7).

While FIG. 7 shows the measured results of the bias voltage dependency of the normalized resistance change $\Delta R$ of the magnetic tunnel element including the tunnel barrier layer comprising the insulating layers in which the Ta oxide film is laminated on the Al oxide film, in another arrangement of a magnetic tunnel element in which a tunnel barrier layer is formed by laminating metal oxide films of more than two kinds, the bias voltage dependency is similarly changed depending upon the direction of the applied bias voltage.

In accordance with the tunnel barrier layer in which the Ta oxide film is laminated on the Al oxide film as shown in FIGS. 6 and 7, when the bias voltage is applied to the magnetic tunnel element in such a manner that the tunnel current flows from the upper electrode to the lower electrode (in the positive (+) direction in FIGS. 6 and 7), the bias voltage dependency could be reduced more effectively.

In actual practice, the bias voltage may be applied to the magnetic tunnel element in such a manner that the tunnel current may flow from the low insulating barrier to the high insulating barrier of the tunnel barrier layer.

Specifically, when the upper side of the insulating barrier is high as seen from the substrate, the lower electrode side should preferably be held at a high potential with the result that the tunnel current may flow from the lower electrode to the upper electrode.

Figure 8:
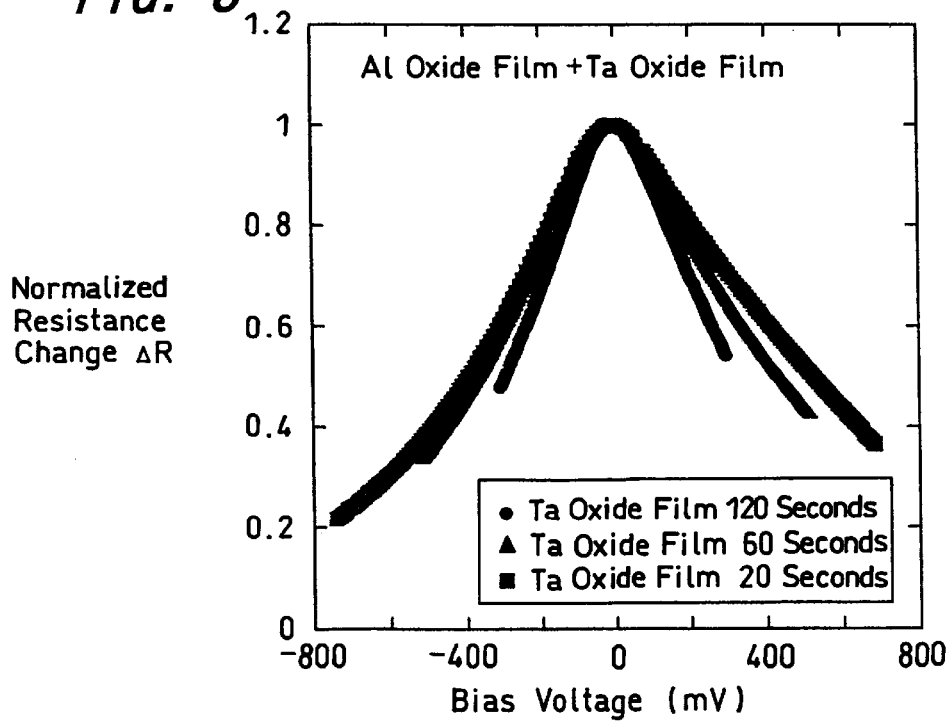
FIG. 8 is a graph showing changes of a bias voltage dependence obtained when the oxidation conditions of the Ta oxide film are changed in the structure in which the Ta oxide film is laminated on the Al oxide film.

Further, we have examined the manner in which the bias voltage dependency is changed when the oxidation conditions of the insulating layer are changed. FIG. 8 shows measured results obtained from the above-mentioned examination. FIG. 8 shows measured results obtained from the structure of the magnetic tunnel element in which a Ta oxide film is laminated on an Al oxide film under the state in which the oxidation conditions of the Al oxide film of the lower layer are selected to be constant while the oxidation conditions of the Ta oxide film of the second tunnel barrier layer are changed. To be more concrete, FIG. 8 shows measured results of the changes of the bias voltage dependency obtained under the condition that the oxidation time required when the Ta oxide film is formed by oxidizing the Ta film was selected to be 120 seconds (solid circle), 60 seconds (solid triangle) and 20 seconds (solid square) for comparison, respectively. Also in this case, the direction of the applied bias voltage is set to the positive direction (+) when the tunnel current flows from the upper electrode to the lower electrode.

As shown in FIG. 8, the bias voltage dependency is changed by changing the oxidation time required to form the Ta oxide film, i.e., the degree of the oxidation.

Then, in this case, it is to be appreciated that, when the degree of the oxidation is decreased by reducing the oxidation time, the bias voltage dependency is alleviated so that the degree in which the normalized resistance change ΔR is lowered can be decreased.

As shown in FIG. 8, when the bias voltage dependency of the normalized resistance change ΔR is alleviated, the bias voltage dependency of the magnetoresistive ratio (MR ratio) also can be alleviated.

While FIG. 8 shows the measured results of the bias voltage dependency obtained from the magnetic tunnel element in which the tunnel insulating layer is formed by laminating the Ta oxide film on the Al oxide film, the bias voltage dependency also is similarly changed by changing the oxidation conditions in another arrangement of metal oxide films. It is to be considered that, when the oxidation conditions of the metal oxide film (Al film, etc.) of the high insulating barrier are changed contrary to FIG. 8, the bias voltage dependency can be alleviated as the oxidation time increases and the degree of the oxidation increases.

Accordingly, it is to be understood that the bias voltage dependency of the MR ratio can be controlled to a certain extent by changing the conditions under which the metal oxide film is oxidized.

As shown in FIG. 8, when the bias voltage is applied in the positive (+) direction, i.e., the upper layer side is held at a high potential such that the tunnel current may flow from the electrode of the upper portion to the electrode of the lower portion, the bias voltage dependency can be alleviated more effectively.

Accordingly, if the upper side in which the height of the insulating barrier is made low by the Ta oxide film is held at a high potential and the lower side in which the height of the insulating barrier is made high by the Al oxide film is held at a low potential, then the bias voltage dependency can be alleviated effectively and hence an output based upon the magnetoresistive effect can be increased.

Next, respective embodiments of a thin-film magnetic head and a magnetic memory to which the magnetic tunnel element according to the present invention is applied will be described below.

Figure 9:
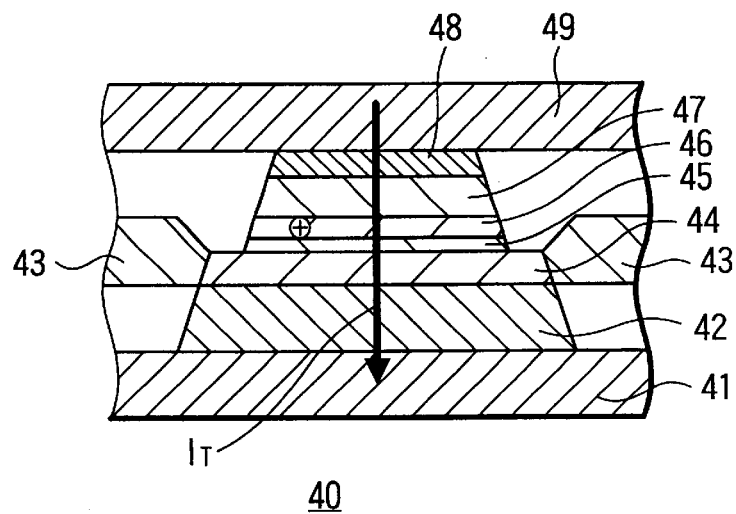
FIG. 9 is a schematic cross-sectional view showing an inventive example of a thin-film magnetic head to which the magnetic tunnel element according to the present invention is applied.

FIG. 9 is a schematic diagram (cross-sectional view) showing an inventive example of a thin-film magnetic head to which the magnetic tunnel element according to the present invention is applied. Specifically, FIG. 9 is a cross-sectional view of the thin-film magnetic head taken along the plane parallel to a head sliding surface in which the thin-film magnetic head is opposed to a recording medium.

A thin-film magnetic head, generally depicted by reference numeral 40 in FIG. 9, is comprised of a lower magnetic shield 41 serving as an electrode layer on which a first ferromagnetic layer (magnetization free layer) 44, an insulating layer 45, a second ferromagnetic layer (magnetization fixed layer) 46 and an antiferromagnetic layer 47 are sequentially laminated through an electrode layer 42 and an upper magnetic shield 49 serving as an electrode layer deposited on the antiferromagnetic layer 47 through an electrode layer 48.

By the antiferromagnetic layer 47, the magnetization direction of the second ferromagnetic layer (magnetization fixed layer) 46 is fixed to the direction perpendicular to the sheet of drawing. Hard magnetic layers 43 made of hard magnetic materials of insulating property (or high-resistance) are disposed at the right and left of the first ferromagnetic layer (magnetization free layer) 44 to thereby stabilize the magnetization direction of the first ferromagnetic layer (magnetization free layer) 44.

While the magnetic tunnel element 1 shown in FIG. 3 has the arrangement in which the magnetization free layer 9 is disposed over the magnetization fixed layer 5, i.e., the magnetic tunnel element 1 is of the so-called bottom spin type, this thin-film magnetic head 40 shown in FIG. 9 has an arrangement in which the magnetization free layer 44 is disposed under the magnetization fixed layer 46, i.e., the thin-film magnetic head 40 is of the so-called top spin type.

In this thin-film magnetic head 40, the first ferromagnetic layer (magnetization free layer) 44, the insulating layer 45, the second ferromagnetic layer (magnetization fixed layer) 46 and the antiferromagnetic layer 47 constitute a magnetic tunnel element through which a downward tunnel current shown by an arrow $I_T$ can flow with application of the voltage to the lower magnetic shield 41 and the upper magnetic shield 49.

Then, the magnetization direction of the magnetic free layer 44 is changed by a magnetic field generated from a recording layer, e.g., magnetic layer of a recording medium (magnetic recording medium) in response to recorded information so that a conductance relative to the tunnel current $I_T$ is changed. As a consequence, information recorded on the recording medium can be obtained as a signal output, and hence the thin-film magnetic head 40 is suitable for use as a reproducing magnetic head.

Specifically, this thin-film magnetic head 40 is constructed as a so-called tunnel magnetoresistive effect type head (TMR head).

In this inventive example, in particular, this thin-film magnetic head 40 is constructed by using the aforementioned magnetic tunnel element, i.e., the magnetic tunnel element in which the tunnel barrier layer has the asymmetric barrier, and the insulating layer 45 is formed of the metal oxide film so as to have asymmetric barriers.

A voltage (bias voltage) is applied to the thin-film magnetic head (TMR head) 40 in a way that the tunnel current $I_T$ may flow in the upper and lower portions of the magnetic tunnel element (44, 45, 46, 47).

Then, by using the magnetic tunnel element according to the present invention, i.e., the magnetic tunnel element in which the tunnel barrier layer formed of the insulating layer is formed as the asymmetric insulating barrier, it becomes possible to suppress the magnetoresistive ratio from being lowered on account of the bias voltage and to obtain a high output even under the state of the bias voltage being applied. Accordingly, a signal output obtained when information written in the recording medium is read out can be increased.

Also in this case, the bias voltage should preferably be applied in such a manner that the side in which the height of the barrier of the asymmetric tunnel barriers are high may be held at a low potential. As a result, there can be obtained a high output by suppressing the magnetoresistive ratio due to the bias voltage. When it is desired that the downward tunnel current $I_T$ should flow as shown in FIG. 9, since the upper side is held at a high potential, the tunnel barrier formed by the insulating layer 45 is constructed such that the lower side may become the high barrier.

Since the thin-film magnetic head has the above-mentioned arrangement, the thin-film magnetic head (TMR head) 40 including the magnetic tunnel element according to this inventive example is able to obtain a large reproduced output under the condition that the bias voltage is applied thereto.

Accordingly, when the bias voltage that makes the thin-film magnetic head actually operate, e.g., the voltage that makes such an amount of the tunnel current flow as is capable of reproducing signals of a recording medium is applied, a stabilized high output can be obtained.

Figure 10:
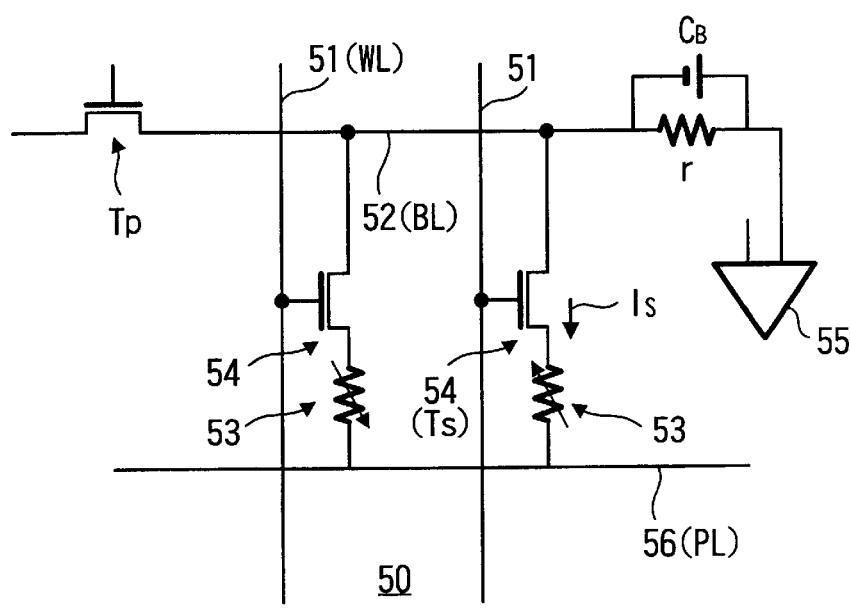
FIG. 10 is a schematic diagram showing a circuit arrangement of an inventive example of a magnetic memory to which the magnetic tunnel element according to the present invention is applied.

FIG. 10 is a schematic diagram of a circuit arrangement of an embodiment of the magnetic memory to which the magnetic tunnel element according to the present invention is applied.

As shown in FIG. 10, this magnetic memory 50 is comprised of a word line (WL) 51 extending in the longitudinal direction and a bit line (BL) 52 extending in the horizontal direction and a memory cell disposed at an intersection at which the word line 51 and the bit line 52 cross each other. Specifically, the magnetic memory 50 includes a large number of memory cells disposed in a two-dimensional fashion, i.e., in an XY matrix fashion.

As shown in FIG. 10, each memory cell includes a magnetic tunnel element 53 and a selection transistor (Ts) 54. One end of the magnetic tunnel element 53 is connected to the selection transistor 54 and the other end of the magnetic tunnel element 53 is connected to a plate line (PL) 56 of the substrate side. The gate of the selection transistor 54 is connected to the word line 51, and the source and the drain of the selection transistor 54 are connected to the bit line 52 and the magnetic tunnel element 53, respectively. In FIG. 10, reference numeral 55 designates an output amplifier.

As the magnetic tunnel element 53, there may be used the aforementioned magnetic tunnel element of the present invention, i.e., the magnetic tunnel element in which the tunnel barrier layer is formed as the asymmetric barrier.

Then, although not shown, the magnetic memory 50 has such an element structure in which the magnetic tunnel element 53 is not only disposed at the intersection between the word line 51 and the bit line 52 but also located between the word line 51 and the bit line 52. Then, one ferromagnetic layer of the magnetic tunnel element 53 is connected to the selection transistor 54 formed of an MOS (metal-oxide semiconductor) transistor through an electrode layer and interconnections.

With the above-mentioned arrangement, the magnetization direction of the magnetization free layer of the magnetic tunnel element 53 is reversed by a synthesized magnetic field between a current magnetic field generated by a current flowing through the word line 51 and a current magnetic field generated by a current flowing through the bit line 52, and hence the magnetization directions can be written in the memory cell as information of "1" and "0". On the other hand, written information can be read out from the memory cell by using the TMR effect, and hence the magnetization direction of the magnetization free layer, i.e., contents of information can be read out from the memory cell based upon a strength of a tunnel current $I_S$ which flows through the magnetic tunnel element 53.

While the magnetization direction of the magnetization free layer of the magnetic tunnel element 53 is inverted when the current magnetic fields of both the word line 51 and the bit line 52 are applied to the selected memory cell as described above, only one current magnetic field of either the word line 51 or the bit line 52 is applied to a memory cell which is not selected so that the magnetization direction of the magnetization free layer of the magnetic tunnel element 53 cannot be inverted. As a result, information can be written in only the selected memory cell.

Figure 11A:
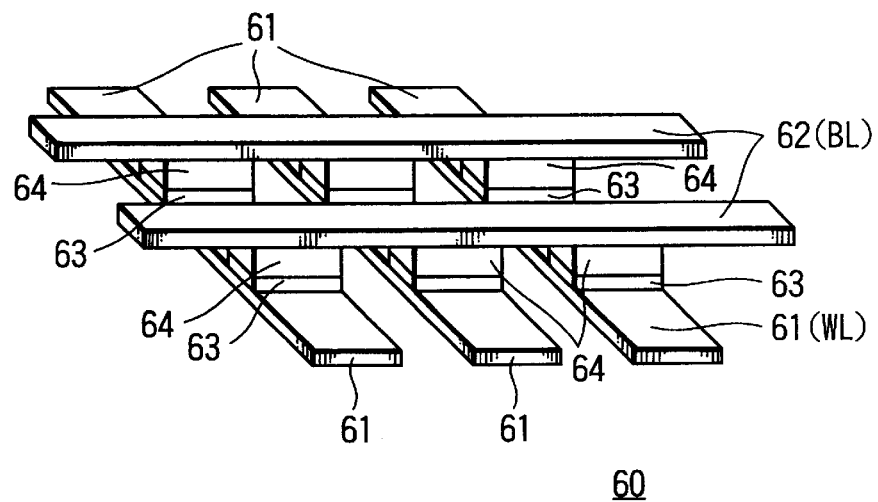
Figure 11B:
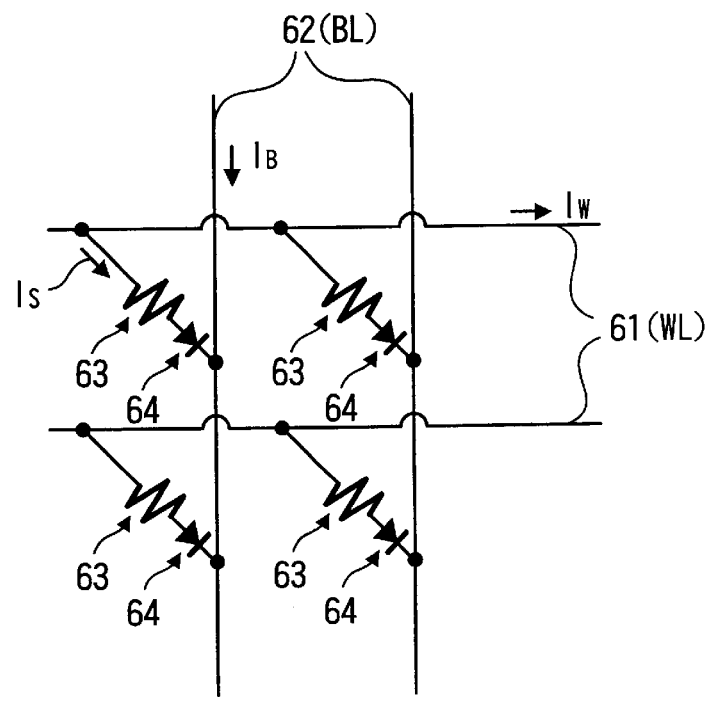

FIGS. 11A and 11B illustrate another inventive example of the magnetic memory of the present invention to which the magnetic tunnel element according to the present invention is applied. Specifically, FIG. 11A is a perspective view illustrating a schematic arrangement of a magnetic memory according to the present invention, and FIG. 11B is a schematic diagram showing a circuit arrangement of a magnetic memory according to the present invention.

A magnetic memory, generally depicted by reference numeral 60 in FIG. 11A, includes a word line (WL) 61, a bit line (BL) 62 and a memory cell disposed corresponding to an intersection between the word line 61 and the bit line 62. Accordingly, the magnetic memory 60 includes a large number of memory cells in an XY matrix fashion.

Each memory cell includes a magnetic tunnel element 63 and a diode 64 formed of an amorphous silicon film. As shown in FIG. 11B, the magnetic tunnel element 63 and the diode 64 are disposed in series, the magnetic tunnel element 63 is connected to the word line 61 and the diode 64 is connected to the bit line 62. A tunnel current $I_S$ is regulated by the diode 64 so that the tunnel current $I_S$ which flows through the magnetic tunnel element 63 may flow from the word line 61 to the bit line 62.

As the magnetic tunnel element 63, there may be used the aforementioned magnetic tunnel element of the present invention, i.e., the magnetic tunnel element in which the tunnel barrier layer is formed as the asymmetric barrier.

Then, the magnetization direction of the magnetization free layer of the magnetic tunnel element 63 is inverted by a synthesized magnetic field between a current magnetic field generated by a current $I_W$ flowing through the word line 61 and a current magnetic field generated by a current $I_B$ flowing through the bit line 62 and thereby information can be written in the memory cell.

Then, in these magnetic memories 50 and 60, since the bias voltage for causing the tunnel current $I_S$ to flow are applied to both sides of the magnetic tunnel elements 53 and 63, when the arrangement of the magnetic tunnel element according to the present invention, i.e., the magnetic tunnel element in which the tunnel barrier layer formed of the insulating layer is formed as the asymmetric barrier is used, the magnetoresistive ratio can be suppressed from being lowered due to the bias voltage, and there can be obtained a high output under the condition that the bias voltage is applied to the magnetic tunnel element.

Accordingly, it is possible to increase a signal output obtained when information is read out from the magnetic tunnel elements 53, 63 of the memory cells.

Also in this case, the bias voltage should preferably be applied to the magnetic tunnel element in such a manner that the side in which the height of the barrier of the asymmetric tunnel barriers are high is held at a high potential. As a result, the magnetoresistive ratio can be suppressed from being lowered due to the bias voltage, and hence there can be obtained a high output.

Further, a magnetic sensor having a similar arrangement can be constructed by using the arrangement of the thin-film magnetic head 40 of the present invention to which the magnetic tunnel element according to the present invention is applied.

According to this magnetic sensor, while the thin-film magnetic head 40 detects the magnetic field corresponding to information recorded on the recording layer of the recording medium, this magnetic sensor is able to detect other external magnetic fields.

Then, the magnetic shields disposed in the upper and lower portions of the magnetic tunnel element, for example, formed as shapes suitable for detecting an external magnetic field, whereby the magnetic sensor can detect an external magnetic field with a high efficiency.

Although the bias voltage should be applied to the magnetic tunnel element to thereby cause a tunnel current to flow in order to detect an external magnetic field, since the asymmetric insulating barrier is formed on the insulating layer serving as the tunnel barrier layer of the magnetic tunnel element when the magnetic tunnel element according to the present invention is applied to this magnetic sensor, it is possible to suppress the magnetoresistive ratio from being lowered due to the bias voltage.

Consequently, since the high output can be obtained by increasing the magnetoresistive ratio provided under the condition that the bias voltage is applied to the magnetic tunnel element as compared with the prior art, it is possible to improve a sensitivity with which the magnetic sensor can detect an external magnetic field.

According to the above-mentioned present invention, since the asymmetric tunnel barriers are formed along the direction of the laminated layers of the magnetic tunnel element by the insulating films formed of the metal oxide films, it becomes possible to suppress the magnetoresistive ratio of the magnetic tunnel element from being lowered due to the bias voltage, i.e., it becomes possible to suppress the bias voltage dependency of the magnetic tunnel element.

As a consequence, even under the condition that the bias voltage is applied to the magnetic tunnel element, the high magnetoresistive ratio can be maintained, and hence it becomes possible to increase the output provided by the change of the magneto-resistance.

Further, according to the present invention, since the bias voltage dependency of the magnetic tunnel element is decreased, when the thin-film magnetic head, the magnetic memory and the magnetic sensor include this magnetic tunnel element, it is possible to construct the thin-film magnetic head, the magnetic memory and the magnetic sensor which can obtain a high output.

Furthermore, it is possible to improve a sensitivity of the magnetic sensor including the magnetic tunnel element.

Therefore, according to the present invention, it is possible to construct the highly-reliable thin-film magnetic head, the high-reliable magnetic memory and the highly-reliable magnetic sensor.

Having described preferred embodiments of the invention with reference to the accompanying drawings, it can be understood that the invention is not limited to those precise embodiments and that various changes and modifications could be effected therein by one skilled in the art without departing from the spirit or scope of the invention as defined in the appended claims.

What is claimed is:

1. A magnetic tunnel element comprising:
   a plurality of ferromagnetic layers; and
   an insulating film formed of a plurality of metal oxide films, wherein said plurality of ferromagnetic layers are laminated across said insulating film and asymmetric tunnel barriers are formed by said insulating film along the direction in which said plurality of ferromagnetic layers are laminated, and wherein heights of the tunnel barriers formed by the respective metal oxide films are different between adjacent metal oxide films.

2. A magnetic tunnel element according to claim 1, wherein a bias voltage is applied to said magnetic tunnel element in such a manner that a potential increases on the higher barrier side of said asymmetric tunnel barriers.

3. A magnetic tunnel element according to claim 1, wherein said metal oxide films are formed of at least no less than one kind of metal oxide films selected from among an aluminum oxide film, a tantalum oxide film and a magnesium oxide film.

4. A thin-film magnetic head comprising:
   a magnetic tunnel element including a plurality of ferromagnetic films and an insulating film formed of a plurality of metal oxide films, wherein said plurality of ferromagnetic films are laminated across said insulating film and asymmetric tunnel barriers are formed along the direction in which said plurality of ferromagnetic layers are laminated by said insulating film, and wherein heights of the tunnel barriers formed by the respective metal oxide films are different between adjacent metal oxide films; and
   upper and lower magnetic shields laminated across said magnetic tunnel element.

5. A magnetic sensor comprising:
   a magnetic tunnel element including a plurality of ferromagnetic films and an insulating film formed of a plurality of metal oxide films, wherein asymmetric tunnel barriers are formed along the direction in which said plurality of ferromagnetic films are laminated by said insulating film, and wherein heights of the tunnel barriers formed by the respective metal oxide films are different between adjacent metal oxide films; and
   upper and lower magnetic shields laminated across said magnetic tunnel element.

* * * * *

UNITED STATES PATENT AND TRADEMARK OFFICE
CERTIFICATE OF CORRECTION

PATENT NO. : 6,760,201 B2
DATED : July 6, 2004
INVENTOR(S) : Eiji Nakashio, Seiji Onoe and Junichi Sugawara It is certified that error appears in the above-identified patent and that said Letters Patent is hereby corrected as shown below:

<u>Title page, Item [54] and Column 1, line 1,</u>
Title, should read as follows: -- MAGNETIC TUNNEL ELEMENT, THIN-FILM MAGNETIC HEAD, AND MAGNETIC SENSOR --

Signed and Sealed this

Eighth Day of February, 2005

JON W. DUDAS
*Director of the United States Patent and Trademark Office*